United States Patent

Kang et al.

(10) Patent No.: US 9,804,212 B2
(45) Date of Patent: Oct. 31, 2017

(54) ENERGY MANAGEMENT SYSTEM

(71) Applicant: LSIS CO., LTD., Anyang-si, Gyeonggi-do (KR)

(72) Inventors: Young Min Kang, Anyang-si (KR); Young Gyu Yu, Seoul (KR)

(73) Assignee: LSIS CO., LTD., Anyang-si (KR)

( * ) Notice: Subject to any disclaimer, the term of this patent is extended or adjusted under 35 U.S.C. 154(b) by 452 days.

(21) Appl. No.: 14/312,256

(22) Filed: Jun. 23, 2014

(65) Prior Publication Data

US 2015/0025702 A1 Jan. 22, 2015

(30) Foreign Application Priority Data

Jul. 22, 2013 (KR) ......................... 10-2013-0086239

(51) Int. Cl.
*G01R 21/133* (2006.01)
*H02J 3/32* (2006.01)
*H02J 3/38* (2006.01)

(52) U.S. Cl.
CPC ............ *G01R 21/1331* (2013.01); *H02J 3/32* (2013.01); *H02J 3/383* (2013.01); *Y02E 10/563* (2013.01); *Y02E 10/566* (2013.01); *Y02E 70/30* (2013.01)

(58) Field of Classification Search
CPC ..... Y02E 70/30; Y02E 10/563; Y02E 10/566; H02J 3/32; H02J 3/383; G01R 21/1331
See application file for complete search history.

(56) References Cited

U.S. PATENT DOCUMENTS

| 2008/0284253 | A1* | 11/2008 | Stenfert Kroese | H02H 3/12 307/131 |
| 2010/0268407 | A1* | 10/2010 | Yanagisawa | B60K 6/46 701/22 |
| 2010/0305890 | A1* | 12/2010 | Huang | G06Q 10/0637 702/62 |
| 2011/0145611 | A1* | 6/2011 | Lee | G01R 22/10 700/291 |

(Continued)

FOREIGN PATENT DOCUMENTS

| JP | 2013-093981 | 5/2013 |
| KR | 10-2010-0013130 | 2/2010 |
| KR | 10-2011-0098346 | 9/2011 |

OTHER PUBLICATIONS

Japan Patent Office Application Serial No. 2014-144371, Office Action dated May 25, 2015, 2 pages.

(Continued)

*Primary Examiner* — Ryan Jarrett
(74) *Attorney, Agent, or Firm* — Lee, Hong, Degerman, Kang & Waimey

(57) ABSTRACT

An energy management system controlling energy flowing into or out of a battery is provided. The energy management system includes a data receiving unit receiving load data and energy data; a total load amount calculating unit calculating the total amount of power consumption by using the received load data; an energy generation amount calculating unit calculating the total amount of power generation by using the received energy data; a comparator comparing the calculated total amount of the power consumption with the calculated total amount of the power generation; and a switch connecting the battery to a power supply according to a comparison result.

12 Claims, 3 Drawing Sheets

(56) References Cited

U.S. PATENT DOCUMENTS

| | | | |
|---|---|---|---|
| 2012/0049625 A1* | 3/2012 | Hopwood | E21B 3/00 307/32 |
| 2012/0181864 A1* | 7/2012 | Honma | H01M 10/44 307/23 |
| 2014/0122177 A1* | 5/2014 | Lai | G06Q 30/0206 705/7.31 |
| 2014/0312621 A1* | 10/2014 | Hung | F03D 7/0272 290/44 |

OTHER PUBLICATIONS

Korean Intellectual Property Office Application Serial No. 10-2013-0086239, Office Action dated Aug. 12, 2016, 4 pages.

* cited by examiner

ENERGY MANAGEMENT SYSTEM

CROSS-REFERENCE TO RELATED APPLICATIONS

Pursuant to 35 U.S.C. §119(a), this application claims the benefit of earlier filing date and right of priority to Korean Patent Application No. 10-2013-0086239, filed on Jul. 22, 2013, the contents of which are all hereby incorporated by reference herein in its entirety.

BACKGROUND

The present disclosure relates to an energy management system, and more particularly, to an energy management system that uses a switch to control an energy storage system.

In general, since a new renewable energy generation system includes energy generation equipment, it is possible to sell energy generated by the new renewable generation system to a related company.

However, a battery Energy Storage System (BESS) stores is equipment of which purpose is to store energy and use stored energy if necessary, and an action of storing energy at a time zone at which an energy cost is low and then selling the energy at a time zone at which the energy cost is high is legally prohibited.

However, a general home energy management system (HEMS) has no function of preventing the legally prohibited action.

FIG. 1 shows a general home energy management system.

Referring to FIG. 1, power is generated by a photovoltaic system 50, and may be supplied to a load 80 connected to a system 10, sold to the system or stored in a battery 70.

A power converting system (PCS) such as a solar power converting unit 51 or a battery power converting unit 71 may include an inverter that converts direct current (DC) power into alternating current (AC) power or vice versa.

A register 53 may measure the amount of power that is generated by the photovoltaic system 50 and supplied to the load 80 or sold to the system 10.

In order to prevent unfair energy trading that means storing energy at a time zone at which an energy cost is low, and then selling the energy at a time zone at which the energy cost is high, a register is not connected to the battery 70.

Thus, the energy management system 20 that manages only a main register 30 and the register 53 may only measure the amount of energy used by the load 80 and the amount of energy generated by a new renewable energy generation system that is installed at home, such as the photovoltaic system 50.

There is a limitation in that it is difficult to check only with the energy management system 20 that the used amount of energy by measured by the main register 30 is affected by the battery 70.

SUMMARY

Embodiments provide an energy management system that compares the supply amount of energy with the consumption amount of energy to control whether to supply energy to an energy storage system.

Embodiments also provide an energy management system in which an energy storage system autonomously collects information on the total supply amount of energy and the total consumption amount of energy, checks the current energy storage state and determines whether to output energy.

In one embodiment, an energy management system controlling energy flowing into or out of a battery includes a data receiving unit receiving load data and energy data; a total load amount calculating unit calculating the total amount of power consumption by using the received load data; an energy generation amount calculating unit calculating the total amount of power generation by using the received energy data; a comparator comparing the calculated total amount of the power consumption with the calculated total amount of the power generation; a switch connecting the battery to a power supply according to a comparison result; and a switch signal transmitting unit receiving the comparison result, generating a switch OFF signal when the total amount of the power generation is larger than the total amount of the power consumption, generating a switch ON signal when the total amount of the power generation is smaller than the total amount of the power consumption, and transmitting the generated switch OFF signal or the generated switch ON signal to the switch.

In another embodiment, an energy management method of an energy management system controlling energy flowing into or out of a battery includes receiving load data and energy data; calculating the total amount of power consumption by using the received load data; calculating the total amount of power generation by using the received energy data; comparing the calculated total amount of the power consumption with the calculated total amount of the power generation; generating, according to the comparison result, a switch OFF signal when the total amount of the power generation is larger than the total amount of the power consumption or a switch ON signal when the total amount of the power generation is smaller than the total amount of the power consumption, and transmitting the generated switch OFF signal or the generated switch ON signal to the switch.

According to embodiments, it is possible to properly control whether to supply energy to an energy storage system by comparing the amount of energy supplied from a new renewable energy generation system installed at home with the amount of energy consumed by a load within home.

According to embodiments, since the energy storage system may autonomously check the current energy storage state and collect information on the total supply amount of energy and the total consumption amount of energy, it is possible to properly control whether to autonomously output energy.

Thus, according to embodiments, it is possible to prevent unfair energy trading that means storing energy in the energy storage system at a time zone at which an energy cost is low, and then selling the energy stored in the energy storage system at a time zone at which the energy cost is high.

DETAILED DESCRIPTION OF THE EMBODIMENTS

Figure 1:
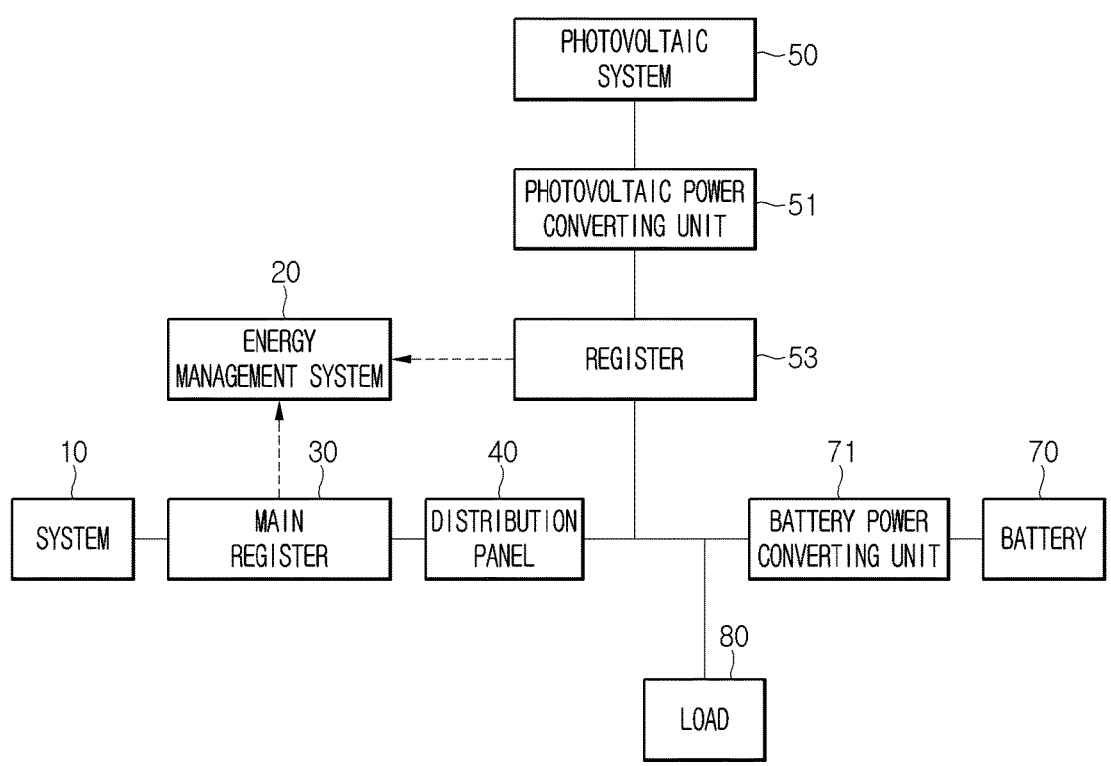
FIG. 1 is a block diagram of a general home energy management system.

Since the present invention make various modifications and have several embodiments, particular embodiments will be illustrated in the drawings and described in the detailed description in detail. However, it is not intended to limit the present invention to particular embodiments but it should be understood that the present invention covers all modifications, equivalents, and/or replacements that fall within the scope and technology of the present invention. When describing the present disclosure, detailed descriptions related to well-known functions or configurations will be ruled out in order not to unnecessarily obscure subject matters of the present disclosure.

Although the terms a first and a second may be used to describe various components, these components should not be limited by these terms. The terms are used only in order to distinguish a component from another component.

The terms used herein are just used to describe specific embodiments and not intended to limit the present invention. The terms in singular form may include the plural form unless otherwise specified. It should be understood that the terms "includes" or "has" indicate the presence of characteristics, numbers, steps, operations, components, parts or combinations thereof represented in the present disclosure but do not exclude the presence or addition of one or more other characteristics, numbers, steps, operations, components, parts or combinations thereof.

Embodiments of a power storage system and a control method thereof are described below in detail with reference to the accompanying drawings and when referring to the drawings, the same or similar components are denoted by the same reference numerals and are not repetitively described.

Figure 2:
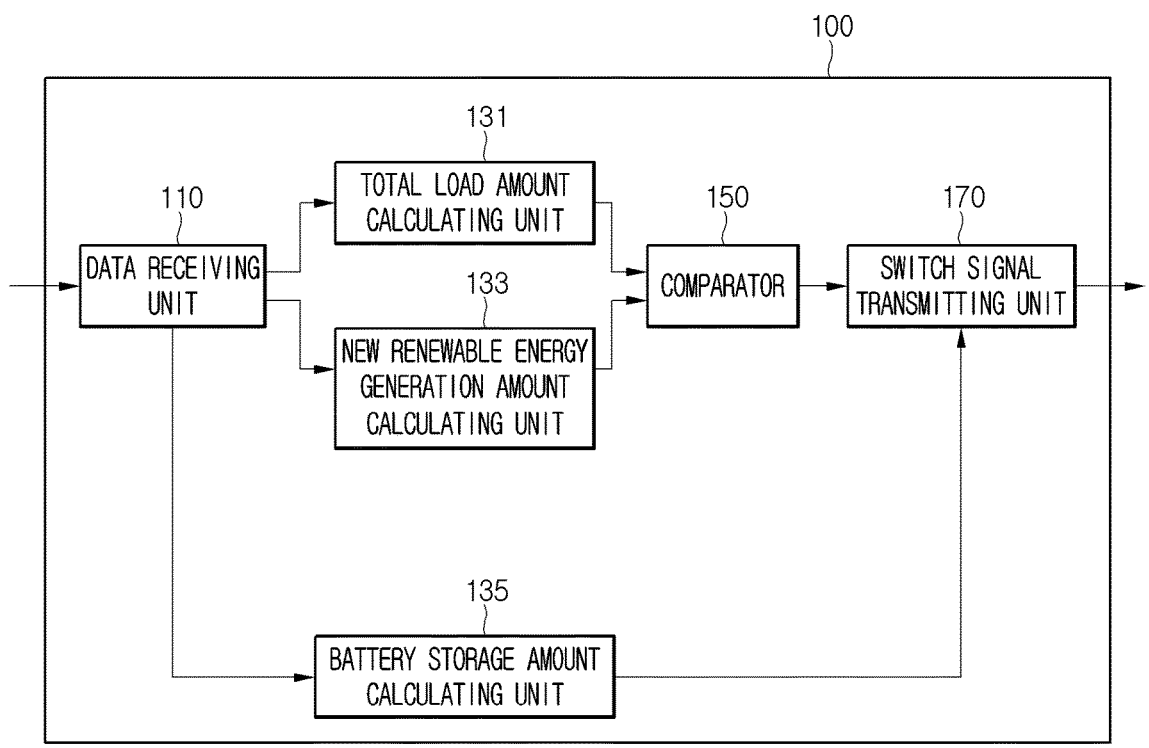
FIG. 2 is a schematic diagram of an energy management system according to an embodiment.

FIG. 2 is a schematic diagram of an energy management system according to an embodiment.

Referring to FIG. 2, an energy management system 100 includes a data receiving unit 110, calculating units 131, 133 and 135, a comparator 150, and a switch signal transmitting unit 170. For reference, the energy management system 100 may be implemented separately from an energy storage system or as a part of the energy storage system.

The data receiving unit 110 receives information such as load data, energy data and battery data.

The load data may include information on the amount of power consumed by a load.

The energy data may include information on the amount of power generated by new renewable energy equipment.

The battery data may include information on the amount of power stored in a battery.

The calculating units 131, 133 and 135 calculate required information from data received by the data receiving unit 110.

The total load amount calculating unit 131 may calculate the sum of load data among data transmitted to the data receiving unit 110. That is, the total load amount calculating unit 131 may calculate the total amount of power consumed by all power consumption products used at home.

The renewable energy generation amount calculating unit 133 may calculate the sum of energy data among data transmitted to the data receiving unit 110. That is, the renewable energy generation amount calculating unit 133 may calculate the total amount of power generated by one or more renewable energy generation systems installed at home.

The battery storage amount calculating unit 135 may calculate battery data among data transmitted to the data receiving unit 110.

The comparator 150 compares the sum of power consumption calculated by the total load amount calculating unit 131 with the sum of power generation calculated by the renewable energy generation amount calculating unit 133. Moreover, the comparator 150 transmits a comparison result to the switch signal transmitting unit 170.

The switch signal transmitting unit 170 transmits a switch ON signal or a switch OFF signal to a switch depending on the comparison result of the load data with the energy data transmitted from the comparator 150.

In this case, when the sum of power generation is larger than that of power consumption as the comparison result by the comparator 150, the switch signal transmitting unit 170 generates the switch OFF signal and makes the switch an OFF state. If the switch is turned OFF, energy is neither stored in a battery nor output therefrom, so it is possible to prevent a certain unfair action that stores residual energy at a time zone at which an energy cost is low, FIG. 3 is a flow chart of the operation of an energy management system according to an embodiment.

Figure 3:
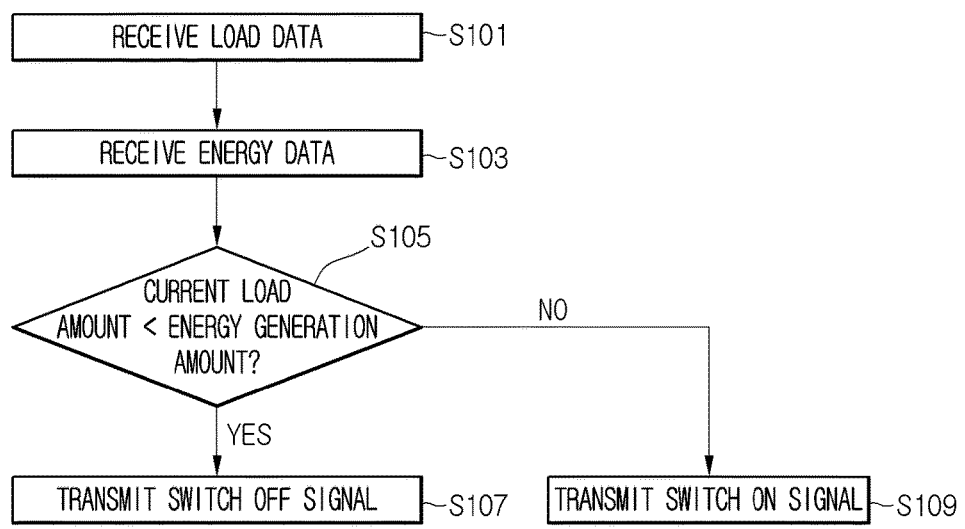
FIG. 3 is a flow chart of the operation of an energy management system according to an embodiment.

Referring to FIG. 3, the data receiving unit 110 receives load data and energy data in steps S101 and S103. The data receiving unit 110 may receive data regularly or at a determined time but the present invention is not limited thereto.

Then, the comparator 150 compares the current load amount calculated by the total load amount calculating unit 131 with energy generation calculated by the renewable energy generation amount calculating unit 133. The current load amount may mean the sum of power consumption and the energy generation amount may mean the sum of power generation.

When the energy generation amount is larger than the current load amount as a comparison result, the switch signal transmitting unit 170 transmits a switch OFF signal to a switch in step S107.

On the other hand, when the energy generation amount is smaller than the current load, the switch signal transmitting unit 170 transmits a switch ON signal to the switch in step S109.

Figure 4:
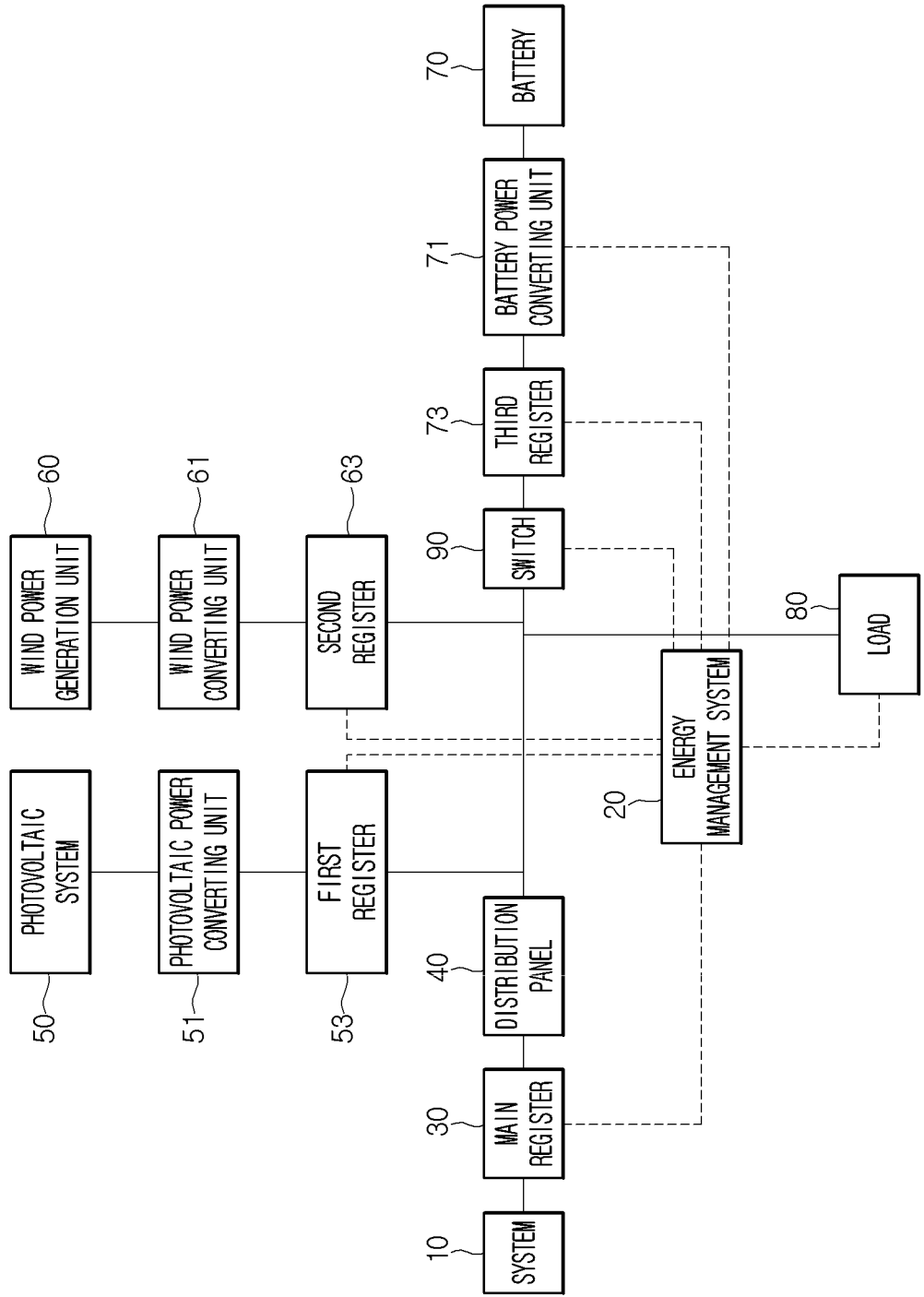
FIG. 4 is a diagram for explaining a battery control method using a switch of an energy management system according to an embodiment.

In the following, how the energy management system according to an embodiment described above with reference to FIGS. 2 and 3 transmits the switch ON signal or the switch OFF signal to the switch and controls power stored in a battery is described in detail. FIG. 4 is a diagram for explaining a battery control method using a switch of an energy management system according to an embodiment.

Referring to FIG. 4, power may be generated, transmitted and consumed at home through the system 10, one or more new renewable energy generation units 50 and 60, and the battery 70, and the load 80.

In order to control such a power flow, the energy management unit 20 may collect energy related information from the main register 30 connected to the system 10, one or more registers 53 and 63 connected to the one or more new renewable energy generation units 50 and 60, the register unit 73 connected to the battery 70, and the load 80 and control the operation of the switch 90, according to an embodiment.

Alternatively, the battery power converting unit 71 may collect energy related information from the energy management unit 20 and control the operation of the switch by using the collected information according to another embodiment. In the following, how the energy management unit 20 collects data irrespective of the battery power converting unit 71 and controls the switch 90, and it may also be applied to when collecting data and controlling the switch by the battery power converting unit 71.

The system 100 is an electric grid that includes a power station, a substation and a transmission line. When the system 10 is in a normal state, the load 80 may receive power from the system 10 for example, and when the system 10 is in an abnormal state, the load 80 may be disconnected from the battery 70 for example.

The main register 30 measures the time-zone dependent usage amount of power consumed by the load 80.

A distribution panel 40 receives power supplied from the system 10 and power generated by the one or more new renewable energy generation units 50 and 60 and distributes the power to various facilities.

The photovoltaic unit 50 generates electrical energy from solar energy. The photovoltaic unit 50 may include photovoltaic panels PVs Direct current (DC) power may be output from the photovoltaic panels.

The solar power converting unit 51 converts energy generated by the photovoltaic unit 50. For example, the solar power converting unit 51 may include a DC-AC converter that converts the DC power supplied through the photovoltaic unit 50 into AC power.

The first register 53 measures the time-zone dependent usage amount of power supplied from the solar power converting unit 51 and thus calculates a time-dependent price.

The wind power generation unit 60 generates electrical energy from wind energy. The wind power generation unit 60 may include a wind turbine. AC power may be output from the wind turbine.

The wind power converting unit 61 converts energy generated by the wind generation unit 60. For example, the wind power converting unit 61 may include an AC-AC converter that converts the AC power supplied through the wind power generation unit 60 into DC power. The AC-AC converter may include a bidirectional converter that converts the AC power supplied through the wind power generation unit 60 into the DC power and then converts the DC power into the AC power, but the present invention is not limited thereto.

The second register 63 measures the time-zone dependent usage amount of power supplied from the wind power converting unit 61 and thus calculates a time-dependent price.

The battery 70 stores the AC power converted through the solar power converting unit 51 or the wind power converting unit 61. Alternatively, the battery 70 may also receive power from the system 10 and be charged. The battery 70 may include one or more battery cells which may be e.g., a nickel-cadmium battery, a lead storage battery, a nickel metal hydride battery NiMH, a lithium-ion battery, a lithium-polymer battery, a metal-lithium battery, and an air-zinc storage battery. The battery power converting unit 71 converts energy stored in the battery 70. For example, the battery power converting unit 71 may include an AC-DC converter that converts the AC power stored in the battery 70 into DC power.

The third register 73 measures the time-zone dependent usage amount of power output from the battery 70 and thus calculates a time-dependent price.

The switch 90 is turned ON or OFF by the control of the energy management unit 20 to regulate power coming into or output from the battery 70.

The load 80 receives and consumes power from the system 10, the power generation unit 50 or 60, or the battery 70. For example, the load 80 may be a facility that is installed at home, a building, or a factor that receives and consumes the power.

The energy management unit 20 may receive load data from the main register 30 or the load 80 and recognize how great the current load amount is. Moreover, the energy management unit 20 may receive energy data from the first register 53 or the second register 63 and recognize how much the energy generation amount is.

The energy management unit 20 may compare the current load amount with energy generation amount, and if the energy generation amount is more than the current load, it is possible to transmit a switch OFF signal to the switch 90 and block power from flowing into or out of the battery 70.

If the energy generation amount is less than the current load, the energy management unit 20 may transmit a switch ON signal to the switch 90 to enable power from flowing into or outputting from the battery 70.

The energy management unit 20 may use information on the power amount of the battery 70 transmitted from the third register 73 to variably transmit a switch ON signal or a switch OFF signal to the switch 90.

While exemplary embodiments are described above, a person skilled in the art may understand that many modifications and variations may be made without departing from the spirit and scope of the present invention defined in the following claims.

Other embodiments in addition to the above-described embodiments reside in the following claims.

What is claimed is:

1. An energy management system controlling energy flowing into or out of a battery, the energy management system comprising:

a data receiving unit configured to receive load data and energy data;

a total load amount calculating unit configured to calculate a total amount of power consumption by using the received load data;

an energy generation amount calculating unit configured to calculate a total amount of power generation by using the received energy data;

a comparator configured to compare the calculated total amount of power consumption with the calculated total amount of power generation and generate a comparison result;

a switch configured to regulate power flowing into and out of the battery; and a energy management unit configured to:

receive the comparison result;

generate a switch OFF signal for blocking power from flowing into and out of the battery or a switch ON signal for enabling power to flow into and out of the battery, the switch OFF signal generated when the total amount of power generation is larger than the total amount of power consumption and the switch ON signal generated when the total amount of power generation is smaller than the total amount of power consumption; and transmit the generated switch OFF signal or switch ON signal to the switch.

2. The energy management system according to claim 1, wherein the load data is received from a load or a main register.

3. The energy management system according to claim 2, wherein the energy data comprises a time-zone dependent usage amount of power generated by a new renewable energy generation system.

4. The energy management system according to claim 3, wherein the new renewable energy generation system comprises at least a photovoltaic system or a wind power generation system.

5. The energy management system according to claim 2, wherein the load data is received from a main register.

6. The energy management system according to claim 1, wherein:
   the data receiving unit receives the load data and energy data without user input; and
   the total load amount calculating unit autonomously calculates the total amount of power consumption and the energy generation amount calculating unit autonomously calculates the total amount of power generation.

7. An energy management method of an energy management system controlling energy flowing into or out of a battery, the energy management method comprising:
   receiving load data and energy data;
   calculating a total amount of power consumption by using the received load data;
   calculating a total amount of power generation by using the received energy data;
   comparing the calculated total amount of power consumption with the calculated total amount of power generation;
   generating a switch OFF signal for blocking power from flowing into and out of the battery or a switch ON signal for enabling power to flow into and out of the battery, the switch OFF signal generated when the total amount of power generation is larger than the total amount of power consumption and the switch ON signal generated when the total amount of power generation is smaller than the total amount of power consumption; and
   transmitting the generated switch OFF signal or switch ON signal to a switch.

8. The energy management method according to claim 7, wherein the load data is received from a load or a main register.

9. The energy management method according to claim 8, wherein the energy data comprises a time-zone dependent usage amount of power generated by a new renewable energy generation system.

10. The energy management system according to claim 9, wherein the new renewable energy generation system comprises at least a photovoltaic system or a wind power generation system.

11. The energy management method according to claim 8, wherein the load data is received from a main register.

12. The energy management method according to claim 7, wherein:
   the load data and energy data are received without user input; and
   the total amount of power consumption is calculated autonomously and the total amount of power generation is calculated autonomously.

* * * * *